(12) United States Patent
Nagata

(10) Patent No.: US 12,155,508 B2
(45) Date of Patent: Nov. 26, 2024

(54) DIGITAL ISOLATOR

(71) Applicants: Kabushiki Kaisha Toshiba, Tokyo (JP); Toshiba Electronic Devices & Storage Corporation, Tokyo (JP)

(72) Inventor: Minoru Nagata, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/118,271

(22) Filed: Mar. 7, 2023

(65) Prior Publication Data

US 2024/0097302 A1    Mar. 21, 2024

(30) Foreign Application Priority Data

Sep. 21, 2022 (JP) ................ 2022-150208

(51) Int. Cl.
*H04L 25/02* (2006.01)
*H01P 1/36* (2006.01)
*H03K 3/037* (2006.01)
*H03K 19/20* (2006.01)

(52) U.S. Cl.
CPC ............ *H04L 25/0266* (2013.01); *H01P 1/36* (2013.01); *H03K 3/037* (2013.01); *H03K 19/20* (2013.01)

(58) Field of Classification Search
CPC .................................................. H04L 25/0266
See application file for complete search history.

(56) References Cited

U.S. PATENT DOCUMENTS

| 8,890,565 | B2 | 11/2014 | Honda et al. |
| 9,698,728 | B2 | 7/2017 | Kamath et al. |
| 9,735,662 | B2* | 8/2017 | Ikegawa ............... H02M 1/44 |
| 2005/0057277 | A1* | 3/2005 | Chen ............... H04L 25/0266 |
| | | | 326/82 |

FOREIGN PATENT DOCUMENTS

| JP | 2008-289257 A | 11/2008 |
| JP | 5549692 B2 | 7/2014 |
| JP | 2017-147538 A | 8/2017 |

* cited by examiner

*Primary Examiner* — Patrick O Neill
(74) *Attorney, Agent, or Firm* — Kim & Stewart LLP

(57) ABSTRACT

A digital isolator includes: an edge detection circuit configured to output a first detection signal and a second detection signal; a driving buffer circuit configured to output a first edge signal and a second edge signal; an isolation element configured to output a first edge signal and a second edge signal; a receiving inverter circuit configured to output a first reception signal and a second reception signal; a latch circuit configured to latch data based on the pulse of the first received signal and the pulse of the second received signal, and to output an output signal to an output terminal according to the data; a switch circuit configured to switch a state of conduction between the reference potential and the first output and a state of conduction between the reference potential and the second output; and a control circuit configured to control a switching operation.

10 Claims, 10 Drawing Sheets

DIGITAL ISOLATOR

CROSS-REFERENCE TO RELATED APPLICATIONS

This application is based upon and claims the benefit of priority from the prior Japanese Patent Application No. 2022-150208, filed on Sep. 21, 2022 the entire contents of which are incorporated herein by reference.

FIELD

This embodiment relates to a digital isolator.

BACKGROUND

Some conventional edge transmission type digital isolators restore a predetermined digital signal, for example, by performing waveform shaping using a comparator circuit on the secondary side output of the isolation element. However, the comparator circuit of this conventional digital isolator is a differential high-gain analog amplifier that always requires a predetermined current consumption, and must have sufficient high-frequency characteristics to support the maximum transmission rate of the transmission signal.

Therefore, such a conventional digital isolator has the problem of not being able to reduce current consumption, because, for example, even if the transmission rate of the transmission signal is slow or there is no change in the transmission signal, there is current consumption necessary to maintain high-frequency characteristics that can always support the maximum transmission rate.

DETAILED DESCRIPTION

An object of one embodiment is to provide a digital isolator capable of reducing current consumption.

The digital isolator, according to the embodiment, that is an edge transmission type digital isolator, includes:

an edge detection circuit configured to detect an edge of a pulse of a signal based on an input signal input through an input terminal, and to output a first detection signal corresponding to a first polarity edge of the detected pulse and a second detection signal corresponding to an edge of a second polarity opposite to the first polarity of the detected pulse;

a driving buffer circuit configured to output a first drive signal based on the first detection signal, and to output a second drive signal based on the second detection signal;

an isolation element configured to receive the first drive signal and the second drive signal on a primary side, to output a first edge signal based on the first drive signal from a first output on a secondary side, and to output a second edge signal based on the second drive signal from a second output on the secondary side;

a receiving inverter circuit having a first gate to which the first edge signal is input and a second gate to which the second edge signal is input, and configured to output a first reception signal corresponding to the first edge signal and a second reception signal corresponding to the second edge signal;

a latch circuit configured to latch data based on the pulse of the first received signal and the pulse of the second received signal, and to output an output signal to an output terminal according to the data;

a switch circuit configured to switch a state of conduction between the reference potential and a first output of the isolation element, and to switch a state of conduction between the reference potential and a second output of the isolation element; and a control circuit configured to control a switching operation of the switch circuit by a control signal generated based on the output signal.

A digital isolator according to an embodiment will be described in detail below with reference to the accompanying drawings. In addition, the present invention is not limited by these embodiments.

First Embodiment

[Digital Isolator]

Figure 1:
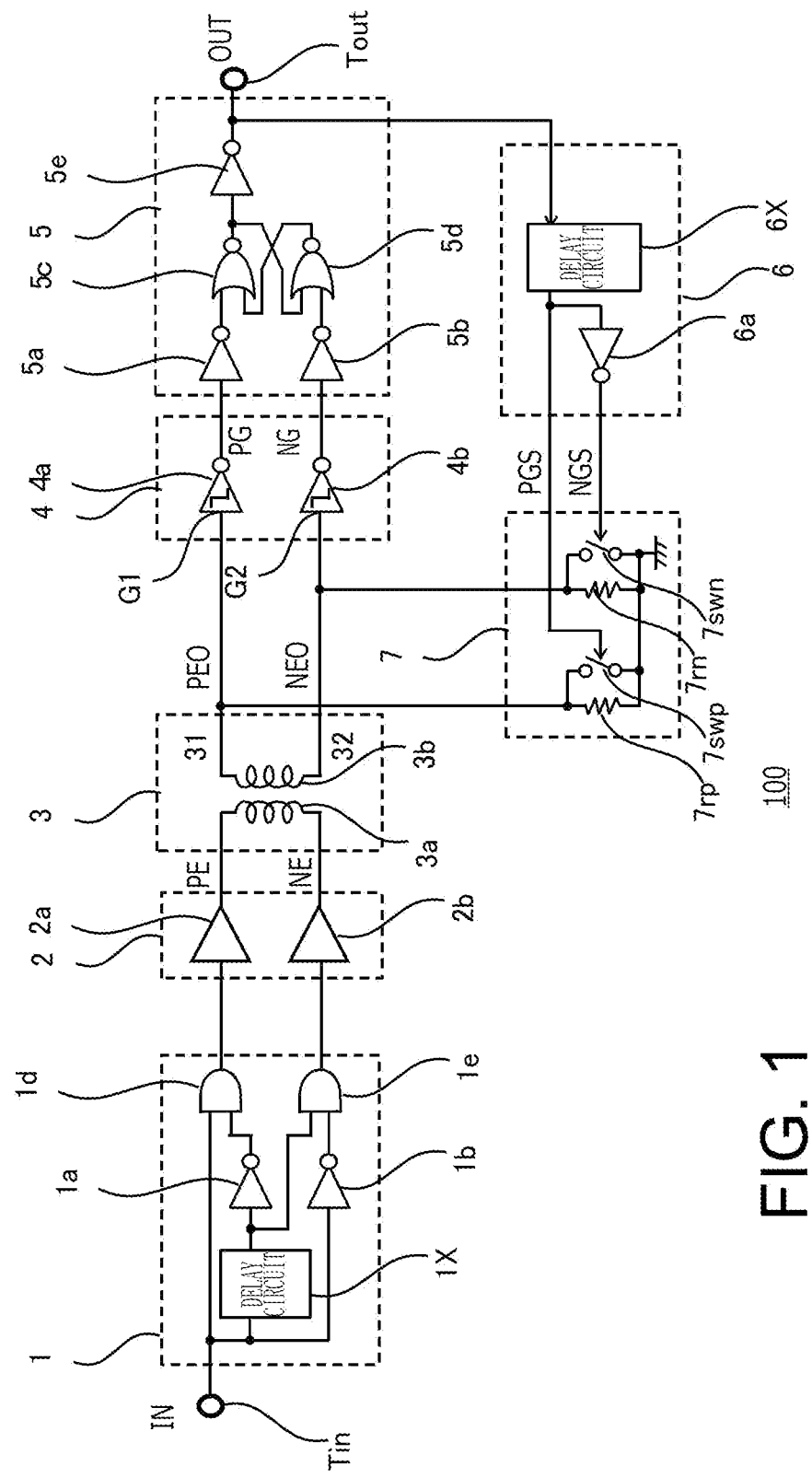
FIG. 1 is a diagram showing an example of the configuration of a digital isolator according to the first embodiment.
Figure 2:
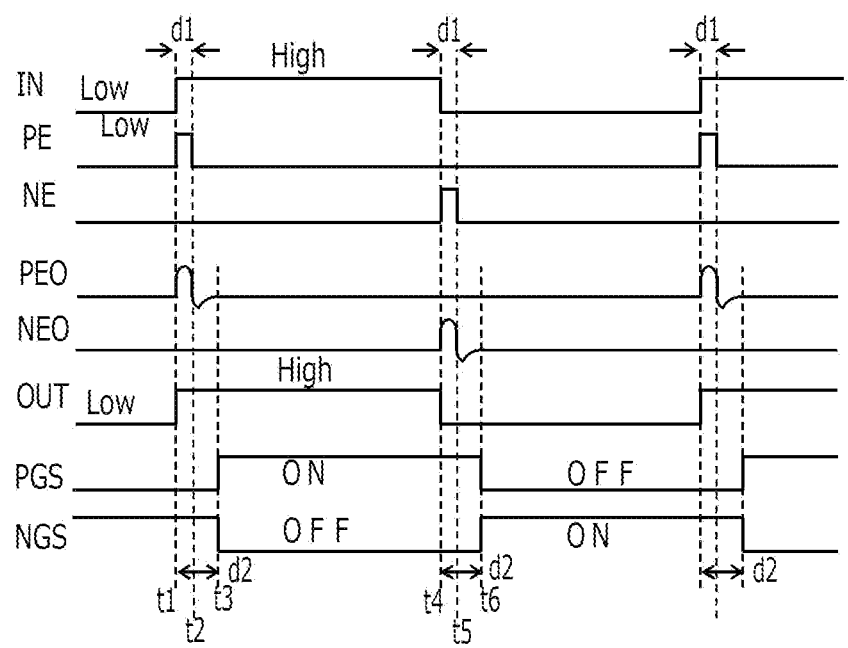
FIG. 2 is a waveform diagram for explaining an example of the operation of the digital isolator shown in FIG. 1.

FIG. 1 is a diagram showing an example of the configuration of a digital isolator according to the first embodiment. FIG. 2 is a waveform diagram for explaining an example of the operation of the digital isolator shown in FIG. 1.

The digital isolator 100 according to the first embodiment is an edge transmission type digital isolator.

For example, as shown in FIG. 1, the digital isolator 100 according to the first embodiment includes an edge detection circuit 1, a driving buffer circuit 2, an isolation element 3, a receiving inverter circuit 4, a latch circuit 5, a control circuit 6, and a switch circuit 7.

Here, as will be described later, each configuration shown in FIG. 1 of the digital isolator 100 according to the first embodiment can significantly reduce current consumption when there is no signal or when the transmission rate is low, because it is not a circuit block that always flows current regardless of the presence or absence of transmission signals.

Each configuration of the digital isolator 100 according to the first embodiment will be described below.

[Edge Detection Circuit]

The edge detection circuit 1 detects the edge of the pulse of the signal (in the example of FIG. 1, the input signal IN) based on the input signal IN input via the input terminal Tin.

The edge detection circuit 1 outputs a first detection signal corresponding to the edge (the positive etch at the rising edge of the signal pulse in the example of FIG. 2) of the first polarity of the detected pulse. Furthermore, the edge detection circuit 1 outputs a second detection signal corresponding to the edge (the negative etching at the trailing edge of the signal pulse in the example of FIG. 2) of the detected pulse having a second polarity opposite to the first polarity.

Here, for example, as shown in FIG. 1, the edge detection circuit 1 includes a detection delay circuit 1x, a first detection inverter 1a, a second detection inverter 1b, a first detection AND circuit 1d, and a second detection AND circuit 1e.

The detection delay circuit 1x receives the input signal IN and outputs a signal obtained by delaying the input signal IN by the first delay time d1.

Also, the first detection inverter 1a outputs a signal obtained by inverting the signal output from the detection delay circuit 1x.

Also, the second detection inverter 1b outputs a signal obtained by inverting the input signal IN.

The first detection AND circuit 1d receives the input signal IN and the signal output from the first detection inverter 1a, and outputs a first detection signal.

The second detection AND circuit 1e receives the signal output from the detection delay circuit 1X and the signal output from the first detection inverter 1a, and outputs a second detection signal.

[Driving Buffer]

The driving buffer circuit 2 is configured to output a first driving signal PE based on the first detection signal output by the edge detection circuit 1. Furthermore, the driving buffer circuit 2 is configured to output a second drive signal NE based on the second detection signal output by the edge detection circuit 1.

For example, as shown in FIG. 1, this driving buffer circuit 2 includes a first driving buffer 2a and a second driving buffer 2b.

Then, for example, as shown in FIG. 1, the first driving buffer 2a receives the first detection signal output by the edge detection circuit 1 and outputs the first drive signal PE.

Also, for example, as shown in FIG. 1, the second driving buffer 2b receives the second detection signal output by the edge detection circuit 1 and outputs the second drive signal NE.

[Isolation Element]

For example, as shown in FIG. 1, the isolation element 3 receives the first drive signal PE and the second drive signal NE output from the driving buffer circuit 2 on the primary side. Furthermore, the isolation element 3 is configured to output a first edge signal PEO based on the first drive signal PE from a first output 31 on the secondary side. Also, the isolation element 3 is configured to output a second edge signal NEO based on the second drive signal NE from a second output 32 on the secondary side.

For example, as shown in FIG. 1, the isolation element 3 includes a primary side coil 3a and a secondary side coil 3b.

For example, as shown in FIG. 1, the primary side coil 3a has one end (connected to the output of the first driving buffer 2a) to which the first drive signal PE is input, and the primary side coil 3a has the other end (connected to the output of the second driving buffer 2b) to which the second drive signal NE is input.

Then, for example, as shown in FIG. 1, the secondary coil 3b has one end connected to the first output 31 from which the first edge signal PEO is output, the secondary coil 3b has the other end connected to the second output 32 from which the second edge signal NEO is output.

The primary side coil 3a and the secondary side coil 3b are configured to form a transformer.

[Receiving Inverter Circuit]

For example, as shown in FIG. 1, the receiving inverter circuit 4 has a first gate G1 connected to the first output 31 of the isolation element 3 and receiving the first edge signal PEO, and the receiving inverter circuit 4 has a second gate G2 connected to the second output 32 of the isolation element 3 and receiving the second edge signal NEO. The reception inverter circuit 4 is configured to output a first reception signal PG corresponding to the first edge signal PEO and a second reception signal NG corresponding to the second edge signal NEO.

For example, as shown in FIG. 1, the receiving inverter circuit 4 includes a first receiving inverter 4a and a second receiving inverter 4b.

The first receiving inverter 4a, for example, as shown in FIG. 1, is configured to receive the first edge signal PEO via the first gate G1 and output the first reception signal PG.

Also, the second receiving inverter 4b, for example, as shown in FIG. 1, is configured to receive the second edge signal NEO via the second gate G2 and output the second reception signal NG.

[Latch Circuit]

The latch circuit 5 is configured to latch data based on the pulse of the first reception signal PG and the pulse of the second reception signal NG output by the receiving inverter circuit 4, and to output an output signal OUT to an output terminal Tout according to the data.

For example, as shown in FIG. 1, the latch circuit 5 includes a first output inverter 5a, a second output inverter 5b, a first NOR circuit 5c, a second NOR circuit 5d, and a third output inverter 5e.

The first output inverter 5a is configured to receive the first reception signal PG output by the first receiving inverter 4a.

Also, the second output inverter 5b is configured to receive the second reception signal NG output by the second receiving inverter 4b.

Also, the first NOR circuit 5c is configured to receive the signal output by the first output inverter 5a and the signal output by the second NOR circuit 5d, and the first NOR circuit 5c is configured to output a signal to the input portions of the third output inverter 5e and the second NOR circuit 5d.

The second NOR circuit 5d is configured to receive the signal output by the second output inverter 5b and the signal output by the first NOR circuit 5c, and the second NOR circuit 5d is configured to output a signal to the input section of the first NOR circuit 5c.

Also, the third output inverter 5e is configured to receive the signal output by the first NOR circuit 5c, and the third output inverter 5e is configured to output an output signal OUT.

[Switch Circuit]

The switch circuit 7 is configured to switch the state of conduction between the reference potential and the first output 31 of the isolation element 3, and the switch circuit 7 is configured to switch the state of conduction between the reference potential and the second output 32 of the isolation element 3.

The reference potential mentioned above is, for example, the ground potential connected to the receiving inverter circuit 4, the latch circuit 5, and the control circuit 6, which constitute the receiving circuit.

Here, for example, as shown in FIG. 1, the switch circuit 7 includes a first resistor 7rp, a first switch element 7swp, a second resistor 7rn, and a second switch element 7swn.

The first resistor 7rp has one end connected to the first output 31 (the first gate G1 of the receiving inverter circuit 4) of the isolation element 3 and the other end connected to the reference potential.

Also, the first switch element 7swp has one end connected to the first output 31 (the first gate G1 of the receiving inverter circuit 4) of the isolation element 3 and the other end connected to the reference potential. The first switch element 7swp is controlled to be turned on/off by a first control signal PGS.

By turning on the first switch element 7swp, the first output 31 of the isolation element 3 and the reference potential are connected, and the potential of the first output 31 is fixed at the reference potential. On the other hand, by turning off the first switch element 7swp, the connection between the first output 31 of the isolation element 3 and the reference potential is cut off (It is insulated by the first resistor 7rp or has a predetermined resistance value).

Also, the second resistor 7rn has one end connected to the second output 32 (the second gate G2 of the receiving inverter circuit 4) of the isolation element 3 and the other end connected to the reference potential.

The second switch element 7swn also has one end connected to the second output 32 (the second gate G2 of the receiving inverter circuit 4) of the isolation element 3 and the other end connected to the reference potential. The second switch element 7swn is configured to be turned on/off by a second control signal NGS.

By turning on the second switch element 7swn, the second output 32 of the isolation element 3 and the reference potential are connected, and the potential of the second output 32 is fixed at the reference potential. On the other hand, by turning off the second switch element 7swn, the connection between the second output 32 of the isolation element 3 and the reference potential is cut off (It is insulated by the second resistor 7rn or has a predetermined resistance value).

[Control Circuit]

The control circuit 6 is configured to control the switching operation of the switch circuit 7 by control signals PGS and NGS generated based on the output signal OUT. In particular, in the example shown in FIG. 1, the control circuit 6 is configured to control the switching operation of the switch circuit 7, by generating the control signals PGS and NGS based on the signal obtained by delaying the output signal OUT.

And, for example, in the example shown in FIG. 1, the control circuit 6 is configured to generate a first control signal PGS for switching the state of conduction between the reference potential and the first output 31 of the isolation element 3, and the control circuit 6 is configured to generate a second control signal NGS for switching the state of conduction between the reference potential and the second output 32 of the isolation element 3.

Here, for example, as shown in FIG. 1, the control circuit 6 includes a control delay circuit 6X and a control inverter 6a.

The control delay circuit 6X is configured to receive the output signal OUT and output a signal obtained by delaying the output signal OUT by the second delay time d2 as the first control signal PGS.

The control inverter 6a is configured to receive a signal (first control signal PGS) output from the control delay circuit 6X, and to output a signal obtained by inverting this signal as a second control signal NGS.

Here, for example, the control circuit 6 is configured to control the switch circuit 7 (that is, turn on the first switch element 7swp) by a control signal (first control signal PGS) so that the first output 31 is connected (fixed) to the reference potential, when the level of the signal obtained by delaying the output signal OUT is the first level (for example, "High" level) based on the pulse of the first received signal PG latched by the latch circuit 5.

Furthermore, the control circuit 6 is configured to control the switch circuit 7 (that is, turn off the second switch element 7swn) by a control signal (second control signal NGS) so that the connection between the second output 32 and the reference potential is cut off (insulated or has a predetermined resistance value), when the level of the signal obtained by delaying the output signal OUT is the first level ("High" level) based on the pulse of the first received signal PG latched by the latch circuit 5.

On the other hand, the control circuit 6 is configured to control the switch circuit 7 (that is, turn on the second switch element 7swn) by a control signal (second control signal NGS) so that the second output 32 is connected (fixed) to the reference potential, when the level of the signal obtained by delaying the output signal OUT is a second level (for example, "Low" level) different from the first level based on the pulse of the second received signal NG latched by the latch circuit 5.

Furthermore, the control circuit 6 is configured to control the switch circuit 7 (that is, turn off the first switch element 7swp) by a control signal (first control signal PGS) so that the first output 31 and the reference potential are cut off (insulated or have a predetermined resistance value), when the level of the signal obtained by delaying the output signal OUT is the second level ("Low" level) based on the pulse of the second received signal NG latched by the latch circuit 5.

Next, an example of the operation of the digital isolator 100 according to the first embodiment having the above configuration will be described. Here, as described above, FIG. 2 is a waveform diagram for explaining an example of the operation of the digital isolator shown in FIG. 1.

For example, as shown in FIG. 2, when the input signal IN becomes "High" level at time t1, a pulse having a width of the first delay time d1 of the first drive signal PE is output (to time t2). At this time, the second drive signal NE has not changed.

Here, from time t1 to time t3 (during the second delay time d2), the control circuit 6 turns off the first switch element 7swp by the first control signal PGS so as to cut off between the first output 31 and the reference potential, since the level of the signal obtained by delaying the output signal OUT is the second level ("Low" level). As a result, based on the pulse of the first drive signal PE, the isolation element 3 outputs the first edge signal PEO corresponding to the pulse from the first output 31 on the secondary side (time t1 to time t2).

Furthermore, during the time t1 to time t3 (during the second delay time d2), the control circuit 6 turns on the second switch element 7swn by the second control signal NGS so that the second output 32 is fixed at the reference potential, since the level of the signal obtained by delaying the output signal OUT is the second level ("Low" level). Thereby, the second edge signal NEO is fixed at the reference potential.

After that, from time t3 to time t4, the control circuit 6 turns on the first switch element 7swp by the first control signal PGS so that the first output 31 is fixed at the reference potential, since the level of the signal obtained by delaying the output signal OUT becomes the first level ("High" level).

Furthermore, during the period from time t3 to time t4, the control circuit 6 turns off the second switch element 7swn by the second control signal NGS so that the connection between the second output 32 and the reference potential is cut off, since the level of the signal obtained by delaying the output signal OUT becomes the first level ("High" level).

As a result, the edge signals (first edge signal PEO and second edge signal NEO) from the isolation element 3 can be sufficiently received by the gates (the first receiving inverter 4a and the second receiving inverter 4b of the receiving inverter circuit 4).

After that, at time t4, when the input signal IN becomes "Low" level, a pulse having a width of the first delay time d1 of the second driving signal NE is output (to time t5). At this time, the second drive signal NE has not changed.

Here, from time t4 to time t6 (during the second delay time d2), the control circuit 6 turns off the second switch element 7swn by the second control signal NGS so that the connection between the second output 32 and the reference potential is cut off, since the level of the signal obtained by delaying the output signal OUT is the first level ("High" level). As a result, based on the pulse of the second drive signal NE, the isolation element 3 outputs the second edge signal NEO corresponding to the pulse from the second output 32 on the secondary side (time t4 to time t5).

Furthermore, during the time t4 to time t6 (during the second delay time d2), the control circuit 6 turns on the first switch element 7swp by the first control signal PGS so that the first output 31 is fixed at the reference potential, since the level of the signal obtained by delaying the output signal OUT is the first level ("High" level). As a result, the first edge signal PEO is fixed at the reference potential.

After that, in the digital isolator 100, similar operations are repeated according to the input signal IN.

As mentioned above, the digital isolator 100 does not have a circuit block such as a comparator through which current always flows, and the digital isolator 100 is capable of transmitting a predetermined digital signal, because an edge signal from the isolation element 3 is received by a gate (receiving inverter circuit 4), by the above operation of the digital isolator 100.

Therefore, the digital isolator 100 according to the first embodiment can significantly reduce current consumption when there is no signal or when the transmission rate is low, because, regardless of the presence or absence of transmission signals, there is no need for a circuit block in which current always flows.

That is, according to the digital isolator 100 according to the first embodiment, current consumption can be reduced.

Here, in the above-described first embodiment, an example of the configuration of the digital isolator has been described. However, the configuration of this digital isolator is not limited to this. Therefore, other examples of the configuration of the digital isolator will be described in the following second to seventh embodiments.

Second Embodiment

Figure 3:
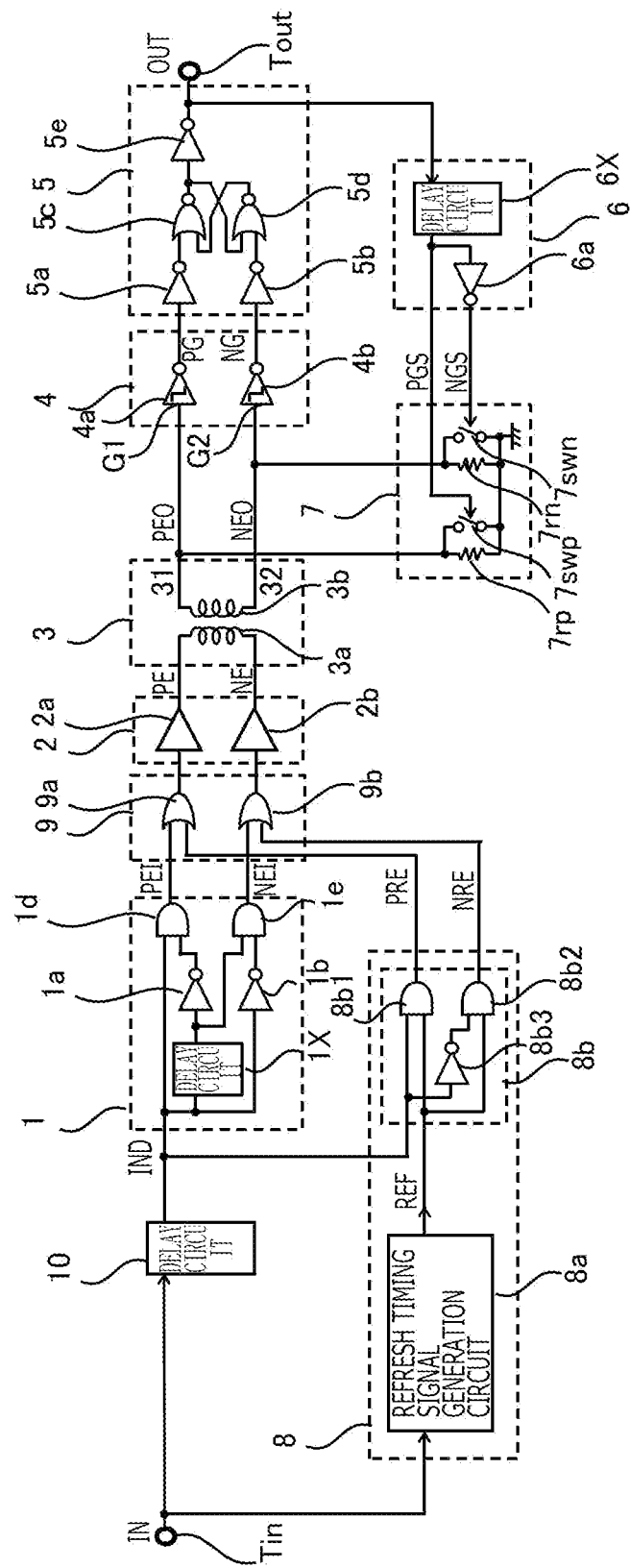
FIG. 3 is a diagram showing an example of the configuration of a digital isolator according to the second embodiment.
Figure 4:
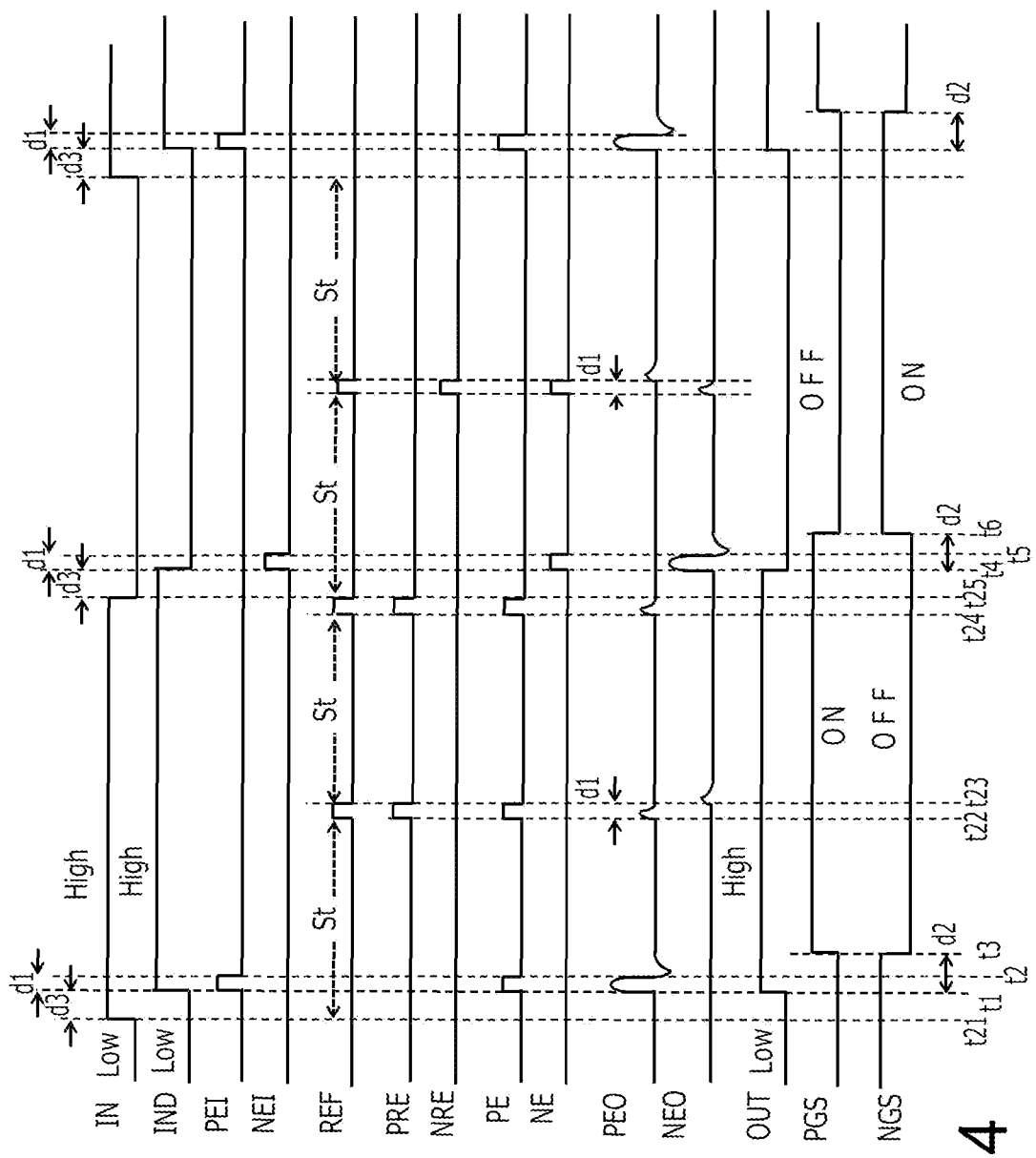
FIG. 4 is a waveform diagram for explaining an example of the operation of the digital isolator shown in FIG. 3.

Next, a digital isolator according to the third embodiment will be described with reference to FIG. 3. FIG. 3 is a diagram showing an example of the configuration of a digital isolator according to the second embodiment. FIG. 4 is a waveform diagram for explaining an example of the operation of the digital isolator shown in FIG. 3.

In the following description, among the constituent elements shown in FIG. 3, the constituent elements that are the same as those shown in FIG. 1 are given the same reference numerals as those shown in FIG. 1, and their explanations are omitted. Also, of the waveforms shown in FIG. 4, portions that are the same as the waveforms shown in FIG. 2 are the same as those in the first embodiment, so description thereof will be omitted.

In edge transmission type digital isolators, it may be preferable to periodically refresh data, for example, as a countermeasure to prevent the latch of the latch circuit from becoming unstable immediately after the power is turned on, and to avoid the occurrence of garbled data when there is no data change for a long time.

Therefore, in the second embodiment, a countermeasure circuit for periodically refreshing data is added to the circuit on the transmission side of the digital isolator.

That is, for example, compared with the digital isolator 100 according to the first embodiment, the digital isolator 200 according to the second embodiment may further include the input delay circuit 10, the refresh circuit 8, and the adder circuit 9 as components for periodically refreshing data.

The configuration of the digital isolator 200 according to the second embodiment will be described below, focusing on the configuration for periodic data refresh.

[Input Delay Circuit]

For example, as shown in FIG. 3, the input delay circuit 10 is configured to delay the input signal IN (by a third delay time d3) and output the delayed input signal IND to the edge detection circuit 1 (for example, time t21 to time t1 and time t25 to time t4 in FIG. 4). In this case, the edge detection circuit 1 detects the edge of the delayed input signal IND (signal based on input signal IN) and outputs the first detection signal PEI and the second detection signal NEI according to the edge of the pulse of the delayed input signal IND (for example, time t1 to time t2 and time t4 to time t5 in FIG. 4).

That is, in the digital isolator 200 according to the second embodiment, the edge detection circuit 1 is configured to detect an edge of the delayed input signal IND and output a first detection signal PEI and a second detection signal NEI according to the detected pulse edge of the delayed input signal IND.

[Refresh Circuit]

For example, as shown in FIG. 3, the refresh circuit 8 is configured to detect that the input signal IN does not change for a preset set time St and output a first refresh signal PRE and a second refresh signal NRE for refreshing data based on this detection result and the delayed input signal IND (for example, time t1 to time t2, time t22 to time t23, time t24 to time t25, time t4 to time t5 in FIG. 4).

For example, as shown in FIG. 3, the refresh circuit 8 includes a refresh signal generation circuit 8a and a polarity setting circuit 8b.

The refresh signal generation circuit 8a is configured to output a refresh pulse signal REF when the refresh signal generation circuit 8a detects that the input signal IN does not change during the preset set time St (for example, time t22 to time t23 and time t24 to time t25 in FIG. 4).

Also, the polarity setting circuit 8b is configured to receive the refresh pulse signal REF and the delayed input signal IND. Furthermore, the polarity setting circuit 8b is configured to output signals obtained by setting the polarity of the refresh pulse signal REF to be switched as the first refresh signal RRE and the second refresh signal NRE, based on the polarity of the delayed input signal IND.

For example, as shown in FIG. 3, the polarity setting circuit 8b includes a first polarity setting AND circuit 8b1, a second polarity setting AND circuit 8b2, and a polarity setting inverter 8b3.

The polarity setting inverter 8b3 is configured to receive the delayed input signal IND and output a signal obtained by inverting the delayed input signal IND.

The first polarity setting AND circuit 8b1 is configured to receive the refresh pulse signal REF and the delayed input signal IND and output the first refresh signal PRE.

Also, the second polarity setting AND circuit 8b2 is configured to receive the refresh pulse signal REF and the signal output from the polarity setting inverter 8b3 and output the second refresh signal NRE.

[Adder Circuit]

For example, as shown in FIG. 3, the adder circuit 9 is configured to output a signal (in other words, the first detection signal PEI obtained by adding the first refresh signal PRE) obtained by adding the first refresh signal PRE to the first detection signal PEI to the driving buffer circuit 2 (the first driving buffer 2a) (For example, time t1 to t2, time t22 to time t23, time t24 to time t25 in FIG. 4). Furthermore, the adder circuit 9 is configured to output a signal (in other words, the second detection signal NEI obtained by adding the second refresh signal NRE) obtained by adding the second refresh signal NRE to the second detection signal NEI to the driving buffer circuit 2 (second driving buffer 2b).

For example, as shown in FIG. 3, the adder circuit 9 includes a first addition OR circuit 9a and a second addition OR circuit 9b.

Furthermore, for example, as shown in FIG. 3, the first addition OR circuit 9a is configured to receive the first detection signal PEI and the first refresh signal PRE as inputs, and to output a signal (in other words, the first detection signal PEI obtained by adding the first refresh signal PRE) obtained by adding the first refresh signal PRE to the first detection signal PEI.

Also, for example, as shown in FIG. 3, the second addition OR circuit 9b is configured to output a signal (in other words, the second detection signal NEI obtained by adding the second refresh signal NRE) obtained by adding the second refresh signal NRE to the second detection signal NEI.

Here, in the digital isolator 200 according to the second embodiment, the driving buffer circuit 2 (first driving buffer 2a) is configured to output a first drive signal PE based on the signal (the first detection signal PEI obtained by adding first refresh signal PRE) output from the adder circuit 9 (first addition OR circuit 9a). Furthermore, the driving buffer circuit 2 (second driving buffer 2b) is configured to output a second drive signal NE based on the signal (the second detection signal NEI obtained by adding second refresh signal NRE) output from the adder circuit 9 (second addition OR circuit 9b).

Thus, in the digital isolator 200 according to the second embodiment, because a pulse based on the first refresh signal PRE is added to the first drive signal PE, and a pulse based on the second refresh signal NRE is added to the second drive signal NE, which are output from the transmission side, with the first and second edge signals PEO and NEO based on the pulses, the latching of the latch circuit 5 is established immediately after the power is turned on, or data corruption can be avoided when there is no data change for a long time.

In the edge transmission type digital isolator 200 having the above configuration, the periodic refresh of data is performed. in order to prevent the latch of the latch circuit from becoming unstable immediately after power-on, and to avoid data corruption when there is no change in data for a long time, by the arrangement for periodic refresh of data (e.g. input delay circuit 10, refresh circuit 8 and adder circuit 9).

Other configurations and operations of the digital isolator 200 of the second embodiment are similar to those of the digital isolator 100 of the first embodiment.

The digital isolator 200 according to the second embodiment also does not have a circuit block such as a comparator through which current always flows, an edge signal from the isolation element 3 is received by a gate (receiving inverter circuit 4), and a predetermined digital signal can be transmitted, by the operation of the digital isolator 200.

Therefore, the digital isolator 200 according to the second embodiment does not require a circuit block through which current always flows regardless of the presence or absence of a transmission signal. However, the current consumption can be greatly reduced when there is no signal or when the transmission rate is low. By setting an appropriate refresh rate.

That is, according to the digital isolator according to the second embodiment, current consumption can be reduced.

Third Embodiment

Figure 5:
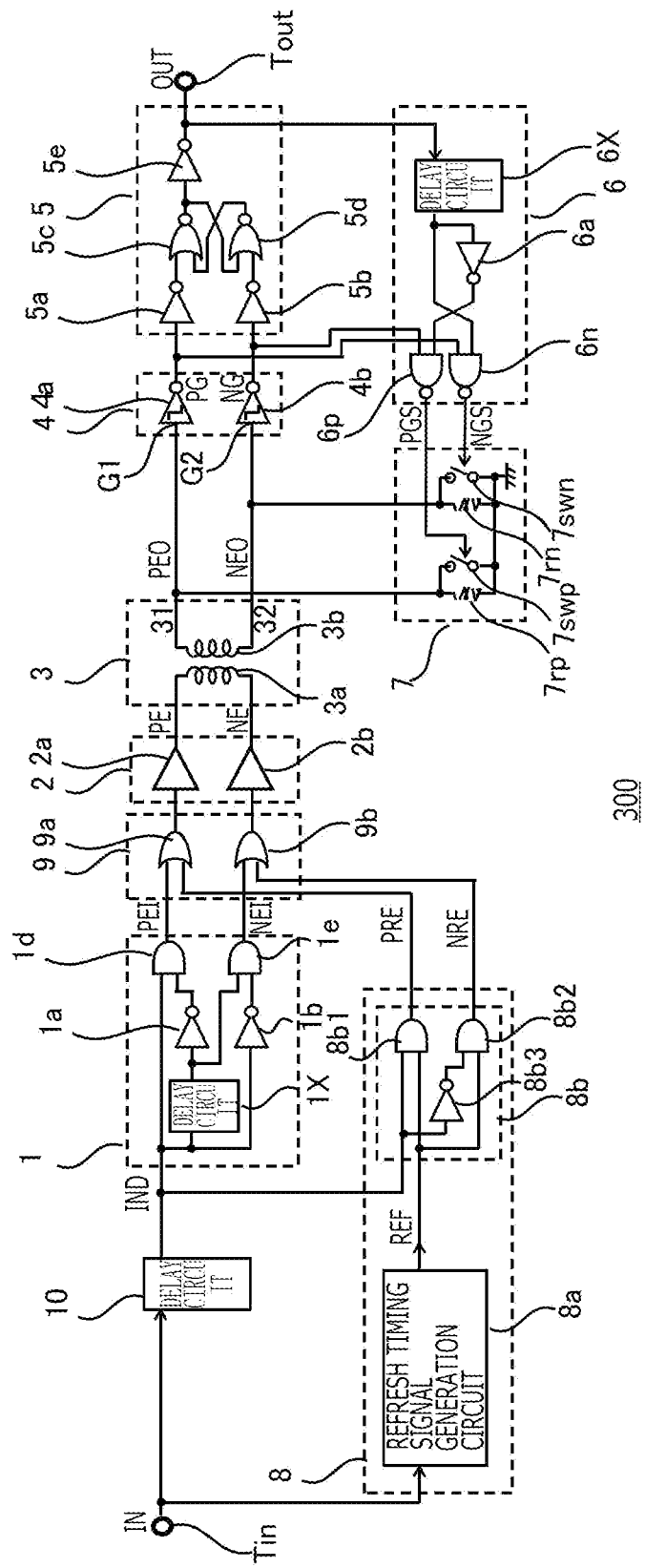
FIG. 5 is a diagram showing an example of the configuration of a digital isolator according to the third embodiment.

Next, a digital isolator according to a third embodiment will be described with reference to FIG. 5. FIG. 5 is a diagram showing an example of the configuration of a digital isolator according to the third embodiment.

In the following description, among the components shown in FIG. 5, the same components as those shown in FIG. 3 are denoted by the same reference numerals as those shown in FIG. 3, and descriptions thereof are omitted.

Here, for example, in the digital isolator 200 according to the second embodiment, if the driving power of the driving buffer circuit 2 (first and second driving buffers 2a, 2b) that drives the transformer of the isolation element 3 is not sufficient, it may be preferable to take countermeasures against erroneous latch inversion that occurs during refresh.

Thus, when the driving power of the driving buffer circuit 2 (first and second driving buffers 2a, 2b) for driving the transformer of the isolation element 3 is not sufficient, the output waveform (first and the pulses of the second edge signals PEO and NEO) do not form an ideal rectangle, but become rounded (attenuated). After the pulses of the first and second edge signals PEO and NEO are finished, the phases of the pulses in the first and second edge signals PEO and NEO are reversed. Also, during transmission of pulses based on the first and second refresh signals PRE and NRE, the sensitivity to opposite-phase pulses is high, in order to receive the original opposite-phase-side pulse while waiting in the receiving inverter circuit 4. Therefore, there is a possibility that the latch in the latch circuit 5 is erroneously inverted due to the reverse phase output component after the end of the edge pulse.

Therefore, in the third embodiment, a function for suppressing erroneous inversion of the latch circuit is added to the circuit on the receiving side of the digital isolator when periodic data refresh is performed.

That is, in the digital isolator 300 according to the third embodiment, for example, compared with the digital isolator 200 according to the second embodiment, the control circuit 6 may be configured to control the switching operation of the switch circuit 7 in order to suppress erroneous inversion of the latch circuit, based on the first received signal PG and the second received signal NG in addition to the signal obtained by delaying the output signal OUT.

The configuration and operation of the control circuit 6 for suppressing erroneous inversion of the latch circuit will be described below with regard to the configuration of the digital isolator 300 according to the third embodiment.

Here, the control circuit 6 of the digital isolator 300 according to the third embodiment is configured to generate the first control signal PGS based on the first received signal PG in addition to the signal obtained by delaying the output signal OUT, and to generate the second control signal NGS based on the signal obtained by delaying the output signal OUT and the second received signal NG.

For example, as shown in FIG. 5, the control circuit 6 of the digital isolator 300 according to the third embodiment includes a control delay circuit 6X, a control inverter 6a, a first control NAND circuit 6p, a second and a control NAND circuit 6n.

The control delay circuit 6X is configured to receive the output signal OUT and output a delayed signal obtained by delaying the output signal OUT by the second delay time d2.

Also, the control inverter 6a is configured to receive a delay signal output from the control delay circuit 6X and output a signal obtained by inverting this delay signal.

The first control NAND circuit 6p is configured to receive the first reception signal PG output by the first receiving inverter 4a of the receiving inverter circuit 4 and the signal output by the control inverter 6a, and to output the first control signal PGS.

For example, if the first edge signal PEO includes a pulse based on the first refresh signal PRE, that is, a refresh pulse, the first control NAND circuit 6p of the control circuit 6 outputs the first control signal PGS so as to turn on the first switch element 7swp of the switch circuit 7 (the potential of the first output 31 is fixed at the reference potential), based on the first reception signal PG output by the first receiving inverter 4a.

Furthermore, the second control NAND circuit 6n is configured to receive the second reception signal NG output from the second receiving inverter 4b and the signal output from the control delay circuit 6, and to output a second control signal NGS.

For example, if the second edge signal NEO includes a pulse based on the second refresh signal NRE, that is, a refresh pulse, the second control NAND circuit 6n of the control circuit 6 outputs a second control signal NGS so as to turn on the second switch element 7swn of the switch circuit 7 (the potential of the second output 32 is fixed at the reference potential), based on the second reception signal NG output by the second receiving inverter 4b.

That is, the control circuit 6 configured as described above controls the switching operation of the switch circuit 7 based on the first received signal PG and the second received signal NG in addition to the signal obtained by delaying the output signal OUT, when pulses based on the first and second refresh signals PRE and NRE, that is, refresh pulses are included.

Therefore, when pulses based on the first and second refresh signals PRE and NRE, that is, refresh pulses are included, it is possible to suppress erroneous inversion of the latch of the latch circuit 5 due to the reverse phase output component after receiving the refresh pulse, by turning on the first and second switch elements 7swp and 7swn of the switch circuit 7.

Other configurations and operations of the digital isolator 300 of the third embodiment are similar to those of the digital isolator 200 of the second embodiment.

That is, according to the digital isolator according to the third embodiment, current consumption can be reduced.

Fourth Embodiment

Figure 6:
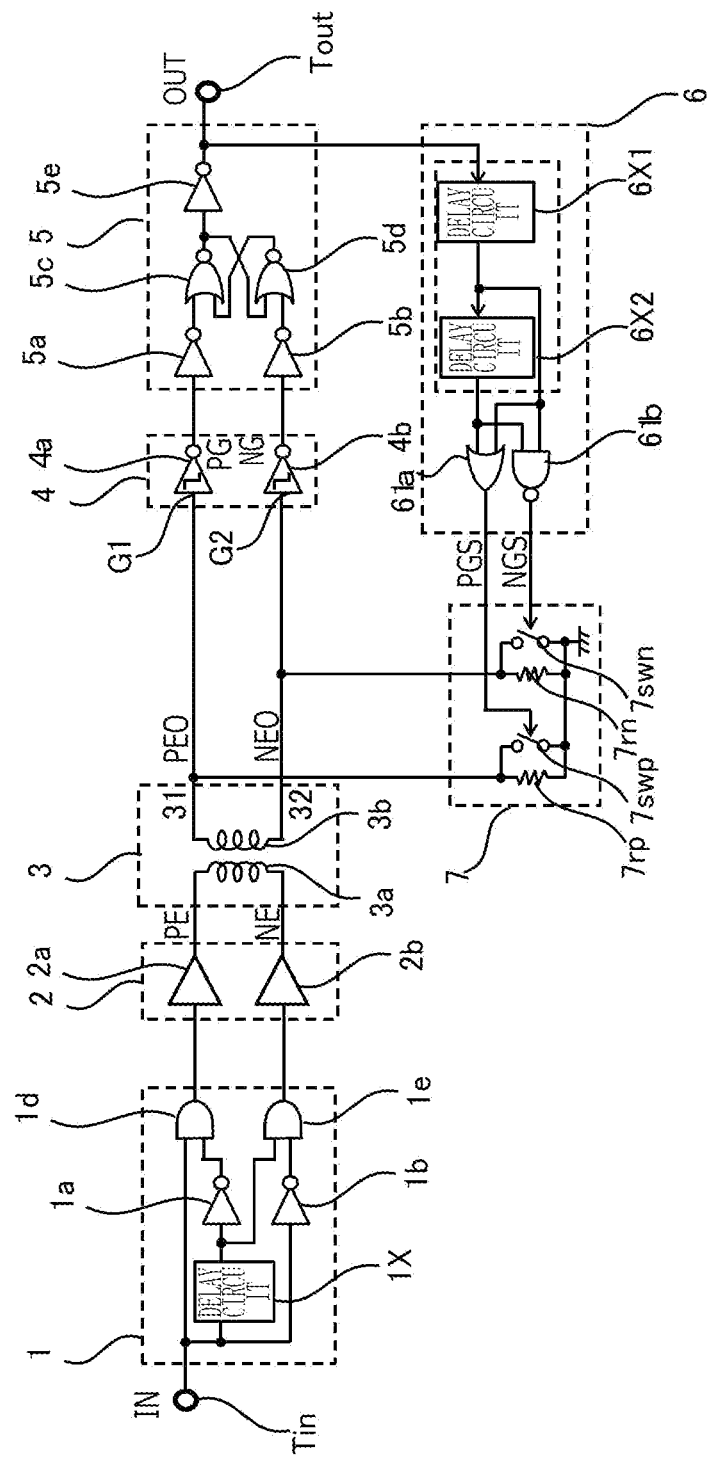
FIG. 6 is a diagram showing an example of the configuration of a digital isolator according to the fourth embodiment.
Figure 7:
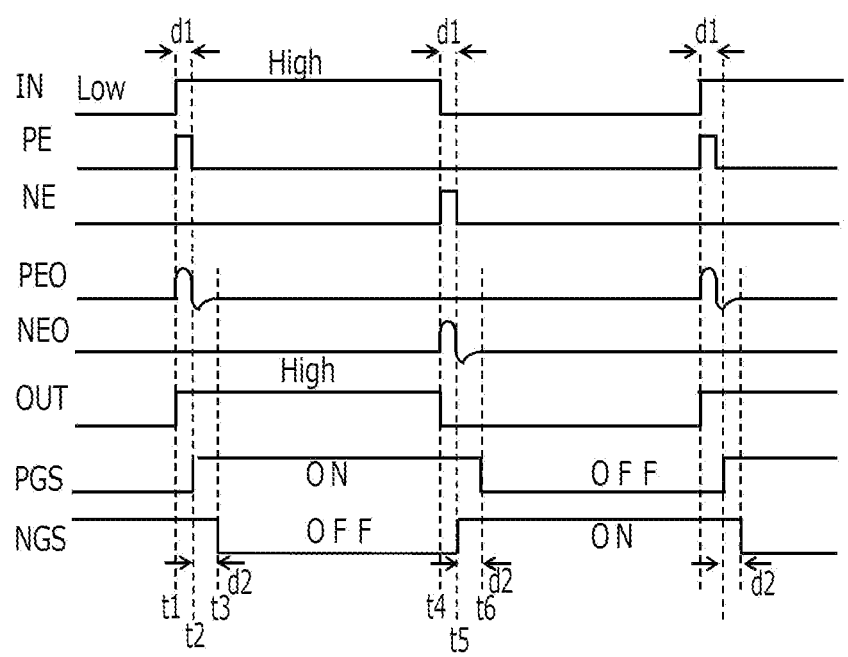
FIG. 7 is a waveform diagram for explaining an example of the operation of the digital isolator shown in FIG. 6.

Next, a digital isolator according to a fourth embodiment will be described with reference to FIG. 6. FIG. 6 is a diagram showing an example of the configuration of a digital isolator according to the fourth embodiment. FIG. 7 is a waveform diagram for explaining an example of the operation of the digital isolator shown in FIG. 6.

In the following description, among the constituent elements shown in FIG. 6, the constituent elements that are the same as the constituent elements shown in FIG. 1 are given the same reference numerals as those shown in FIG. 1, and their explanations are omitted. Also, in the waveforms shown in FIG. 7, portions that are the same as the waveforms shown in FIG. 2 are the same as those in the first embodiment, so description thereof will be omitted.

As shown in FIG. 6, the control circuit 6 of the digital isolator 400 according to the fourth embodiment may include a first control delay circuit 6X1, a second control delay circuit 6X2, a control OR circuit 61a, and a control NAND circuit 61b.

The first control delay circuit 6X1 is configured to receive an output signal OUT and output a first delay signal obtained by delaying the input output signal OUT by a first delay time d1.

The second control delay circuit 6X2 is configured to receive the first delay signal and output the second delay signal obtained by delaying the input first delay signal by the second delay time d2.

The control OR circuit 61a is configured to receive the first delay signal output by the first control delay circuit 6X1 and the second delay signal output by the second control delay circuit 6X2, and to output the first control signal PGS based on these first and second delay signals.

For example, between times t5 and t6 in FIG. 7 (that is, the second delay time d2), the control OR circuit 61a of the control circuit 6 is configured to output the first control signal PGS so as to keep the first switch element 7swp of the switch circuit 7 ON (the potential of the first output 31 is fixed at the reference potential), based on the first and second delay signals.

Furthermore, the control NAND circuit 61b is configured to receive the first delay signal output by the first control delay circuit 6X1 and the second delay signal output by the second control delay circuit 6X2, and to output a second control signal NGS based on these first and second delay signals.

For example, between times t2 and t3 in FIG. 7 (that is, the second delay time d2), the NAND circuit 61b of the control circuit 6 is configured to output a second control signal NGS so as to keep the second switch element 7swn of the switch circuit 7 ON based on the first and second delay signals (the potential of the second output 32 is fixed at the reference potential).

The control circuit 6 of the digital isolator 400 according to the fourth embodiment having such a configuration can suppress the inversion of the opposite phase due to the return of the opposite phase occurring during the second delay time d2. by keeping the switch element of the switch circuit 7 on the opposite phase side turned on until the second delay time d2 period in which the opposite phase turns back (time t2 to time t3, time t5 to time t6 in FIG. 7).

Other configurations and operations of the digital isolator 400 of the fourth embodiment are similar to those of the digital isolator 100 of the first embodiment.

Other configurations and operations of the digital isolator 500 of the fifth embodiment are similar to those of the digital isolator 400 of the fourth embodiment.

Fifth Embodiment

Figure 8:
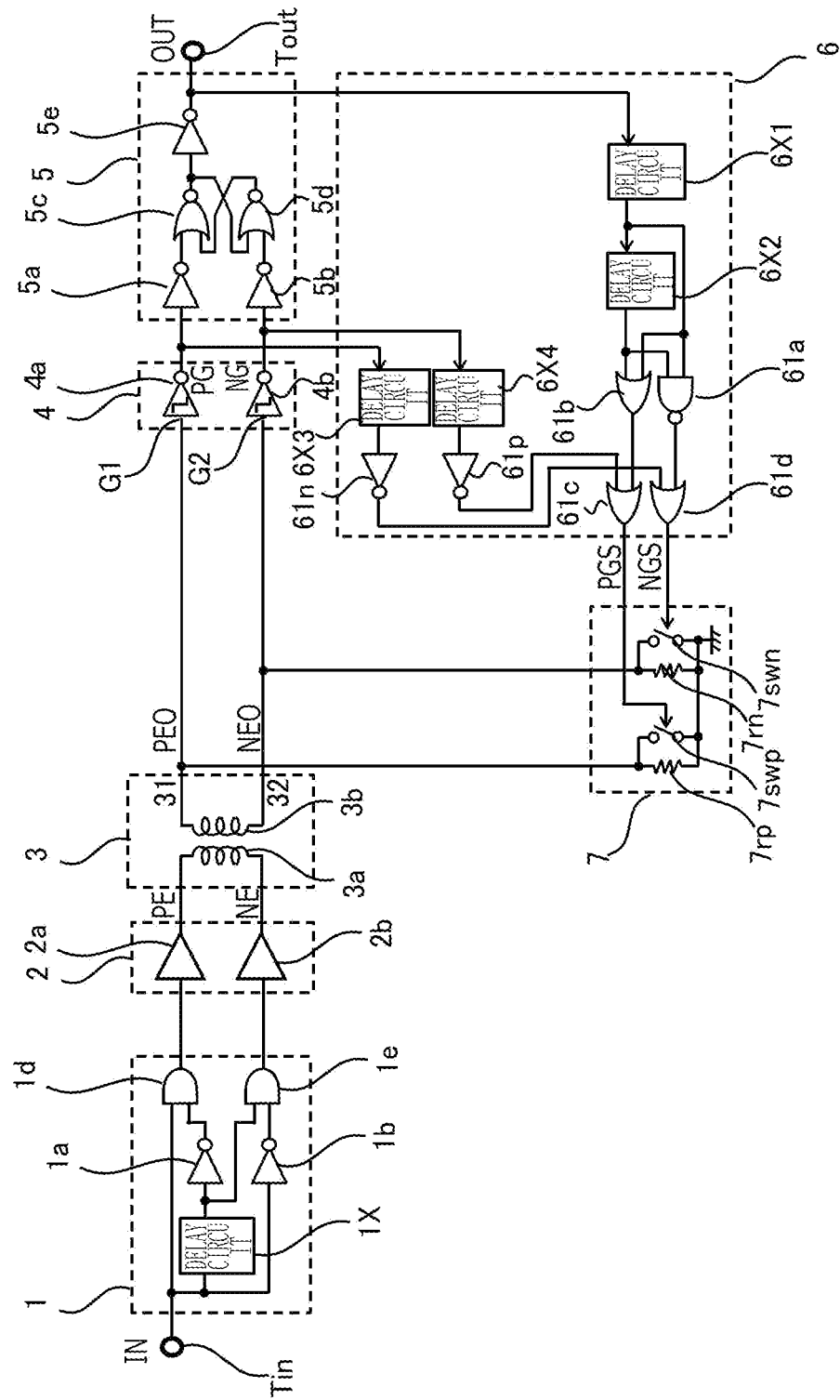
FIG. 8 is a diagram showing an example of the configuration of a digital isolator according to the fifth embodiment.

Next, a digital isolator according to the fifth embodiment will be described with reference to FIG. 8. FIG. 8 is a diagram showing an example of the configuration of a digital isolator according to the fifth embodiment.

In the explanation below, among the components shown in FIG. 8, the same components as those shown in FIG. 6 of the fourth embodiment are denoted by the same reference numerals as those shown in FIG. 6 of the fourth embodiment. Description is omitted.

As shown in FIG. 8, the control circuit 6 of the digital isolator 500 according to the fifth embodiment is configured to control the switching operation of the switch circuit 7, based on the first received signal PG and the second received signal NG in addition to the signal obtained by delaying the output signal OUT.

Here, for example, as shown in FIG. 8, the control circuit 6 includes a first control delay circuit 6X1, a second control delay circuit 6X2, a third control delay circuit 6X3, a fourth control delay circuit 6X4, a first control OR circuit 61*a*, a control NAND circuit 61*b*, a first control inverter 61*n*, a second control inverter 61*p*, a second control OR circuit 61*c*, and a third control OR circuit 61*d*.

The first control delay circuit 6X1 is configured to receive the output signal OUT and output a first delay signal obtained by delaying the output signal OUT by the first delay time d1.

The second control delay circuit 6X2 is configured to receive the first delay signal and output the second delay signal obtained by delaying the input first delay signal by the second delay time d2.

The first control OR circuit 61*a* is configured to receive the first delay signal output from the first control delay circuit 6X1 and the second delay signal output from the second control delay circuit 6X2, and to output a signal based on these first and second delay signals.

Also, the control NAND circuit 61*b* is configured to receive the first delay signal output by the first control delay circuit 6X1 and the second delay signal output by the second control delay circuit 6X2, and to output a signal based on these first and second delay signals.

Also, the third control delay circuit 6X3 is configured to receive the first reception signal PG output by the first receiving inverter 4*a*, and to output a signal obtained by delaying the input first reception signal PG by a first delay time d1.

Also, the fourth control delay circuit 6X4 is configured to receive the second reception signal NG output by the second receiving inverter 4*b*, and to output a signal obtained by delaying the input second received signal NG by the first delay time d1.

Also, the first control inverter 61*n* is configured to receive the signal output from the third control delay circuit 6X3 and output a signal obtained by inverting the signal.

The second control inverter 61*p* is configured to receive the signal output from the fourth control delay circuit 6X4 and output a signal obtained by inverting the signal.

The second control OR circuit 61*c* is configured to receive the signal output by the first control OR circuit 61*b* and the signal output by the second control inverter 61*p*, and to output the first control signal PGS based on these signals.

The second control OR circuit 61*c* is configured to receive the signal output by the first control OR circuit 61*b* and the signal output by the second control inverter 61*p*, and to output the first control signal PGS based on these signals.

The third control OR circuit 61*d* is configured to receive the signal output by the control AND circuit 61*a* and the signal output by the first control inverter 61*n*, and to output the second control signal NGS based on these signals.

For example, between times t2 and t3 in FIG. 7 (that is, the second delay time d2), the third control OR circuit 61*d* is configured to output the second control signal NGS so as to keep the second switch element 7*swn* of the switch circuit 7 ON (to fix the potential of the second output 32 to the reference potential).

The control circuit 6 of the digital isolator 500 according to the fifth embodiment having such a configuration can suppress the inversion of the opposite phase due to the return of the opposite phase occurring during the second delay time d2, by keeping the switch element of the switch circuit 7 on the opposite phase side turned on until the second delay time d2 where the opposite phase turns back (time t2 to time t3, time t5 to time t6 in FIG. 7).

Especially in the fifth embodiment, the output of the receiving inverter is also used to generate a control signal on the opposite phase side for preventing the opposite phase from reversing due to the opposite phase folding that occurs during the second delay time d2. As a result, the number of stages of logic circuits from the receiving inverter to the switching circuit can be reduced, and the influence of timing deviation due to gate delay can be reduced.

Other configurations and operations of the digital isolator 500 of the fifth embodiment are similar to those of the digital isolator 400 of the fourth embodiment.

That is, according to the digital isolator according to the fifth embodiment, current consumption can be reduced.

Sixth Embodiment

Figure 9:
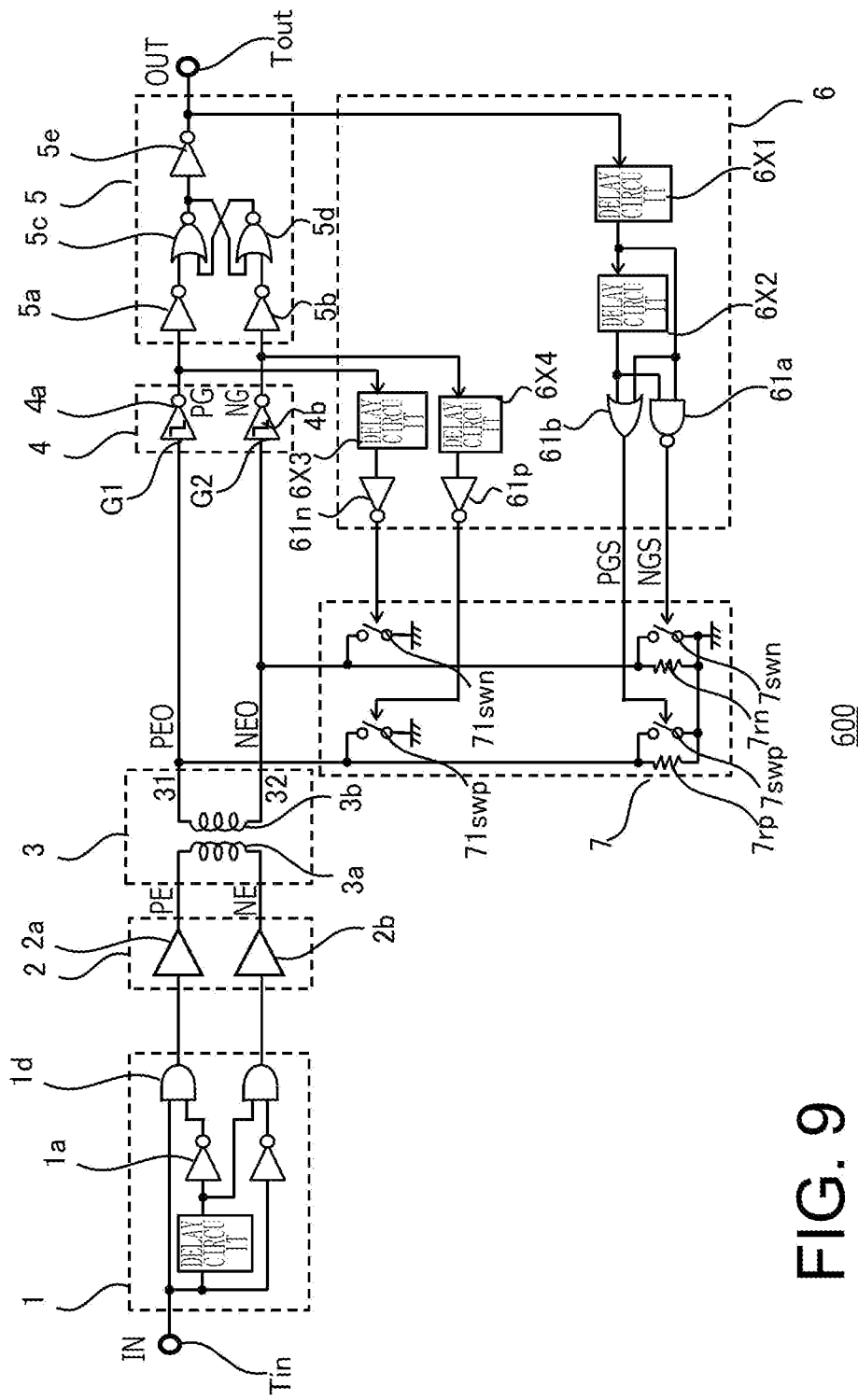
FIG. 9 is a diagram showing an example of the configuration of a digital isolator according to the sixth embodiment.

Next, a digital isolator according to the sixth embodiment will be described with reference to FIG. 9. FIG. 9 is a diagram showing an example of the configuration of a digital isolator according to the sixth embodiment.

In the following description, among the components shown in FIG. 9, the description of the same components as those shown in FIG. 6 of the fourth embodiment will be omitted, by attaching the same reference numerals as those shown in FIG.

Here, for example, compared with the switch circuit 7 of the digital isolator 400 according to the fourth embodiment, the switch circuit 7 of the digital isolator 600 according to the sixth embodiment further includes a third switch element 71*swp* and a fourth switch element 71*swn*.

The third switch element 71*swp* has one end connected to the first output 31 (the first gate G1 of the receiving inverter circuit 4) of the isolation element 3 and the other end connected to the reference potential. The third switch element 71*swp* is controlled to be on/off by the third control signal output by the control circuit 6 based on the second reception signal NG.

Also, the fourth switch element 71*swn* has one end connected to the second output 32 of the isolation element 3 (the second gate G2 of the receiving inverter circuit 4) and the other end connected to the reference potential. The fourth switch element 71*swn* is controlled to be turned on/off by the fourth control signal output by the control circuit 6 based on the first reception signal PG.

Furthermore, as shown in FIG. 9, for example, compared with the control circuit 6 of the digital isolator 400 according to the fourth embodiment, the control circuit 6 of the digital isolator 600 according to the sixth embodiment further includes a third control delay circuit 6X3, a fourth control delay circuit 6X4, a first control inverter 61n, and a second control inverter 61p.

Also, the third control delay circuit 6X3 is configured to receive the first reception signal PG output by the first receiving inverter 4a, and to output a signal obtained by delaying the input first received signal PG by a first delay time d1.

Also, the fourth control delay circuit 6X4 is configured to receive the second reception signal NG output by the second receiving inverter 4b, and to output a signal obtained by delaying the input second received signal NG by a first delay time d1.

Also, the first control inverter 61n is configured to receive the signal output from the third control delay circuit 6X3, and to output a fourth control signal for controlling the fourth switch element 71swn based on the received signal.

For example, between times t2 and t3 in FIG. 7 (that is, the second delay time d2), the first control inverter 61n is configured to output a fourth control signal so as to turn on the fourth switch element 71swn of the switch circuit 7 (to fix the potential of the second output 32 to the reference potential).

Also, the second control inverter 61p is configured to receive the signal output from the fourth control delay circuit 6X4, and to output a third control signal for controlling the third switch element 71swp based on the received signal.

For example, between times t5 and t6 in FIG. 7 (that is, the second delay time d2), the second control inverter 61p is configured to output a third control signal to turn on the third switch element 71swp of the switch circuit 7 (fix the potential of the first output 31 to the reference potential).

Also in the digital isolator 600 according to the sixth embodiment, the control circuit 6 can suppress the inversion of the opposite phase due to the return of the opposite phase occurring during the second delay time d2. by turning on the switch element of the switch circuit 7 on the opposite phase side until the section of the second delay time d2 in which the opposite phase turns back (time t2 to time t3, time t5 to time t6 in FIG. 7).

Other configurations and operations of the digital isolator of the sixth embodiment are similar to the configuration of the digital isolator 400 of the fourth embodiment.

That is, according to the digital isolator according to the sixth embodiment, current consumption can be reduced.

Seventh Embodiment

Figure 10:
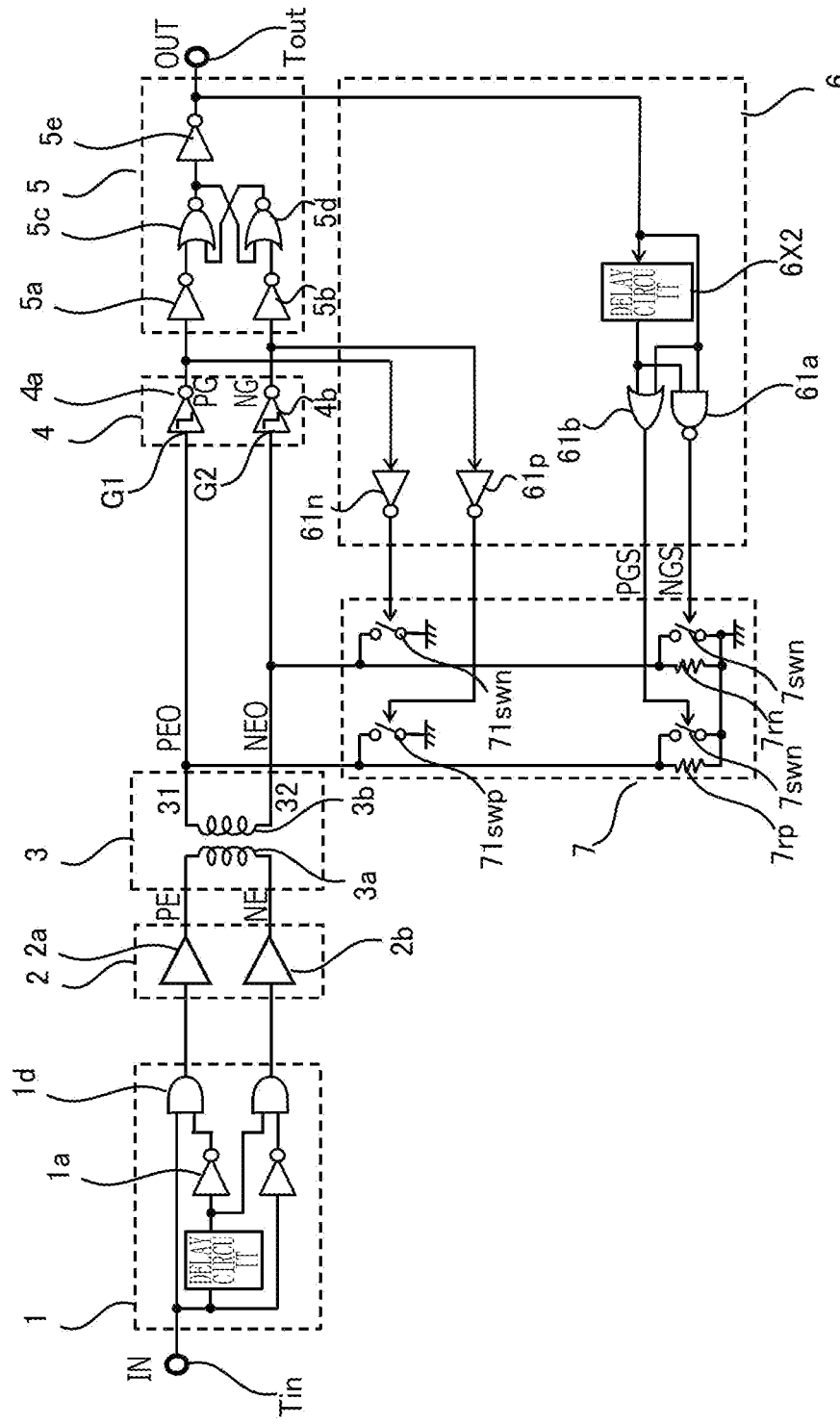
FIG. 10 is a diagram showing an example of the configuration of a digital isolator according to the seventh embodiment.

Next, a digital isolator according to the seventh embodiment will be described with reference to FIG. 10 FIG. 10 is a diagram showing an example of the configuration of a digital isolator according to the seventh embodiment.

In the explanation below, among the constituent elements shown in FIG. 10, the constituent elements that are the same as the constituent elements shown in FIG. 9 according to the sixth embodiment are denoted by the same reference numerals as those shown in FIG. 9, and description thereof will be omitted.

Here, the digital isolator 600 according to the sixth embodiment described above may be designed so as to omit the delay circuit that delays the signal by the first delay time d1 for the explicit edge pulse, by using the transmission delay amount of the gate to cover the originally necessary delay for the pulse width of the edge pulse.

That is, as shown in FIG. 10, compared with the control circuit 6 of the digital isolator 600 according to the sixth embodiment, the control circuit 6 of the digital isolator 700 according to the seventh embodiment has, for example, the first control delay circuit 6X1, the third control The control delay circuit 6X3 and the fourth control delay circuit 6X4 may be omitted.

Also in the digital isolator 700 according to the seventh embodiment, the control circuit 6 is capable of suppressing inversion of the opposite phase due to the return of the opposite phase that occurs during the second delay time d2, by turning on the switch element of the switch circuit 7 on the opposite phase side until the section of the second delay time d2 in which the opposite phase turns back (time t2 to time t3, time t5 to time t6 in FIG. 7).

Other configurations and operations of the digital isolator of the seventh embodiment are similar to those of the digital isolator 600 of the sixth embodiment.

In other words, according to the digital isolator according to the seventh embodiment, current consumption can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

DESCRIPTION OF SYMBOLS

100, 200, 300, 400, 500, 600, 700 digital isolator
1 Edge detection circuit
2 Driving buffer circuit
3 Isolation element
4 Receiving inverter circuit
5 Latch circuit
6 control circuit
7 switch circuit
8 Refresh circuit
9 adder circuit
10 Input delay circuit

The invention claimed is:

1. A digital isolator that is an edge transmission type digital isolator, comprising:
    an edge detection circuit configured to detect an edge of a pulse of a signal based on an input signal input through an input terminal, and to output a first detection signal corresponding to a first polarity edge of the detected pulse and a second detection signal corresponding to an edge of a second polarity opposite to the first polarity of the detected pulse;
    a driving buffer circuit configured to output a first drive signal based on the first detection signal, and to output a second drive signal based on the second detection signal;
    an isolation element configured to receive the first drive signal and the second drive signal on a primary side, to output a first edge signal based on the first drive signal from a first output on a secondary side, and to output a second edge signal based on the second drive signal from a second output on the secondary side;

a receiving inverter circuit having a first gate to which the first edge signal is input and a second gate to which the second edge signal is input, and configured to output a first received signal corresponding to the first edge signal and a second received signal corresponding to the second edge signal;

a latch circuit configured to latch data based on a pulse of the first received signal and a pulse of the second received signal, and to output an output signal to an output terminal according to the data;

a switch circuit configured to switch a state of conduction between a reference potential and the first output of the isolation element, and to switch a state of conduction between the reference potential and the second output of the isolation element; and a control circuit configured to control a switching operation of the switch circuit by a control signal generated based on the output signal.

2. The digital isolator according to claim 1, wherein the control circuit generates the control signal based on a signal obtained by delaying the output signal, and controls the switching operation of the switch circuit.

3. The digital isolator according to claim 2, wherein the control circuit controls the switching operation of the switch circuit based on the first received signal and the second received signal in addition to the signal obtained by delaying the output signal.

4. The digital isolator according to claim 2, wherein the control circuit controls the switch circuit according to the control signal so that the first output is connected to the reference potential, when a level of the signal obtained by delaying the output signal is a first level based on the pulse of the first received signal, which is latched by the latch circuit, and wherein the control circuit controls the switch circuit according to the control signal so that the second output is connected to the reference potential, when the level of the signal obtained by delaying the output signal is a second level different from the first level based on the pulse of the second received signal, which is latched by the latch circuit.

5. The digital isolator according to claim 4, wherein the control circuit controls the switch circuit by the control signal so that the connection between the second output and the reference potential is cut off, when the level of the signal obtained by delaying the output signal is the first level based on the pulse of the first received signal latched by the latch circuit, and wherein the control circuit controls the switch circuit so that the control signal cuts off the first output and the reference potential, when the level of the signal obtained by delaying the output signal is the second level based on the pulse of the second received signal latched by the latch circuit.

6. The digital isolator according to claim 2, wherein the reference potential is a ground potential connected to the receiving inverter circuit, the latch circuit, and the control circuit.

7. The digital isolator according to claim 1, wherein the control circuit controls the switching operation of the switch circuit based on the first received signal and the second received signal in addition to a signal obtained by delaying the output signal.

8. The digital isolator according to claim 7, wherein the control circuit controls the switch circuit according to the control signal so that the first output is connected to the reference potential, when a level of the signal obtained by delaying the output signal is a first level based on the pulse of the first received signal, which is latched by the latch circuit, and wherein the control circuit controls the switch circuit according to the control signal so that the second output is connected to the reference potential, when the level of the signal obtained by delaying the output signal is a second level different from the first level based on the pulse of the second received signal, which is latched by the latch circuit.

9. The digital isolator according to claim 8, wherein the control circuit controls the switch circuit by the control signal so that the connection between the second output and the reference potential is cut off, when the level of the signal obtained by delaying the output signal is the first level based on the pulse of the first received signal latched by the latch circuit, and wherein the control circuit controls the switch circuit so that the control signal cuts off the first output and the reference potential, when the level of the signal obtained by delaying the output signal is the second level based on the pulse of the second received signal latched by the latch circuit.

10. The digital isolator according to claim 1, wherein the reference potential is a ground potential connected to the receiving inverter circuit, the latch circuit, and the control circuit.

* * * * *